United States Patent
Lee et al.

(10) Patent No.: US 7,371,668 B2
(45) Date of Patent: May 13, 2008

(54) METHOD FOR MAKING A METAL OXIDE SEMICONDUCTOR DEVICE

(75) Inventors: Ming-Kwei Lee, Kaohsiung (TW); Jung-Jie Huang, Kaohsiung (TW); Yu-Hsiang Hung, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 243 days.

(21) Appl. No.: 11/270,931

(22) Filed: Nov. 10, 2005

(65) Prior Publication Data

US 2007/0105374 A1 May 10, 2007

(51) Int. Cl.
*H01L 21/44* (2006.01)
*H01L 21/28* (2006.01)

(52) U.S. Cl. ............... 438/583; 438/656; 257/E21.047

(58) Field of Classification Search ................ 438/778, 438/240, 785, 583, 656
See application file for complete search history.

(56) References Cited

U.S. PATENT DOCUMENTS

| | | | | |
|---|---|---|---|---|
| 6,660,660 B2 * | 12/2003 | Haukka et al. | ............. | 438/778 |
| 6,794,315 B1 * | 9/2004 | Klemperer et al. | ......... | 438/785 |
| 2003/0188777 A1 * | 10/2003 | Gaudiana et al. | ........... | 136/263 |
| 2003/0192585 A1 * | 10/2003 | Beckenbaugh et al. | ..... | 136/263 |
| 2004/0043557 A1 * | 3/2004 | Haukka et al. | ............. | 438/240 |
| 2004/0129978 A1 * | 7/2004 | Hirai | ......................... | 257/347 |

* cited by examiner

*Primary Examiner*—Michael Lebentritt
*Assistant Examiner*—Seahvosh Nikmanesh
(74) *Attorney, Agent, or Firm*—Christie, Parker & Hale, LLP

(57) ABSTRACT

A method for making a MOS device includes: forming an insulator layer on a semiconductor substrate, the insulator layer including a titanium dioxide film that has a surface with hydroxyl groups formed thereon; and forming an aluminum cap film on the surface of the titanium dioxide film, and conducting annealing operation of the aluminum cap film at an annealing temperature sufficient to permit formation of active hydrogen atoms through reaction of the aluminum cap film and the hydroxyl groups, thereby enabling hydrogen passivation of oxide traps in the titanium dioxide film through diffusion of the active hydrogen atoms into the titanium dioxide film.

11 Claims, 8 Drawing Sheets

METHOD FOR MAKING A METAL OXIDE SEMICONDUCTOR DEVICE

BACKGROUND OF THE INVENTION

1. Field of the Invention

This invention relates to a method for making a metal-oxide-semiconductor (MOS) device, more particularly to a method involving formation of a hydrogen-passivated polycrystalline titanium dioxide film on a semiconductor substrate.

2. Description of the Related Art

A metal oxide semiconductor (MOS) device, such as MOS capacitors and transistors, includes an insulator film sandwiched between an electrode layer and a semiconductor substrate. Conventionally, the insulator film is made from silicon dioxide. With rapid integration of elements and scale down of the MOS devices, the silicon dioxide film is required to be thinned to a considerable extent, and the area thereof is required to be smaller and smaller. However, when the thickness of the silicon dioxide film is below 2.5 nm, the likelihood of current leakage is relatively high due to direct tunneling effect. In addition, it is also an issue on how to maintain the desired capacitance when the area of the silicon dioxide film is further reduced. In order to overcome the aforesaid drawbacks, a high dielectric constant material, such as titanium dioxide, has been proposed heretofore to replace silicon dioxide. Conventionally, a polycrystalline titanium dioxide film is formed using metal organic chemical vapor deposition (MOCVD) techniques. However, the performance of a MOSFET device with the titanium dioxide film is relatively poor due to the presence of a large number of defects, such as grain boundary defects, interface traps, oxide traps, and oxygen vacancies, in the polycrystalline titanium dioxide film, and a relatively low energy barrier height for the titanium dioxide, which can result in severe current leakage.

SUMMARY OF THE INVENTION

Therefore, the object of the present invention is to provide a method for making a metal-oxide-semiconductor (MOS) device that is capable of overcoming the aforesaid drawbacks of the prior art.

According the present invention, there is provided a method for making a metal-oxide-semiconductor (MOS) device. The method comprises: forming an insulator layer on a semiconductor substrate, the insulator layer including a titanium dioxide film that has a surface with hydroxyl groups formed thereon; and forming an aluminum cap film on the surface of the titanium dioxide film, and conducting annealing operation of the aluminum cap film at an annealing temperature sufficient to permit formation of active hydrogen atoms through reaction of the aluminum cap film and the hydroxyl groups, thereby enabling hydrogen passivation of oxide traps in the titanium dioxide film through diffusion of the active hydrogen atoms into the titanium dioxide film.

BRIEF DESCRIPTION OF THE DRAWINGS

In drawings which illustrate an embodiment of the invention.

DETAILED DESCRIPTION OF THE PREFERRED EMBODIMENT

Figure 1:
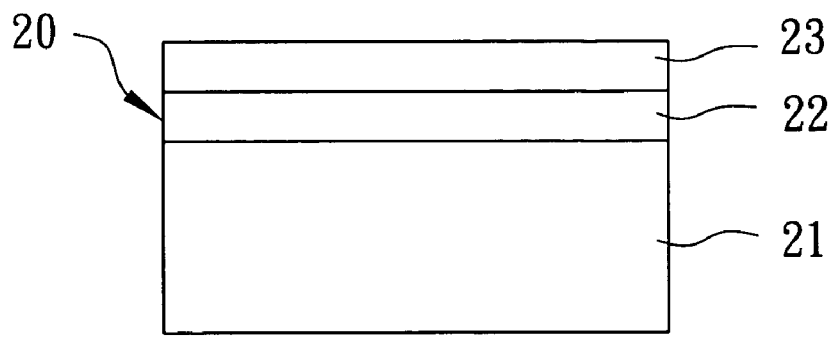
FIGS. 1 and 2 are schematic views to illustrate consecutive steps of the preferred embodiment of a method for making a metal-oxide-semiconductor (MOS) device according to this invention.
Figure 2:
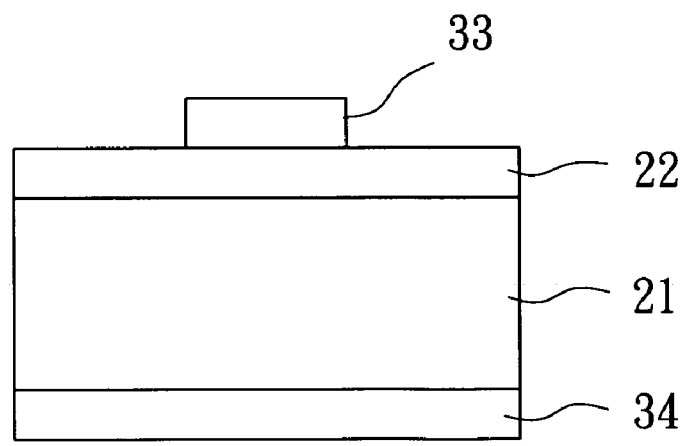

FIGS. 1 and 2 illustrate the consecutive steps of the preferred embodiment of a method for making a metal-oxide-semiconductor (MOS) device according to the present invention.

The method includes the steps of: forming an insulator layer 20 on a semiconductor substrate 21, the insulator layer 20 including a titanium dioxide film 22 that has a surface with hydroxyl groups formed thereon; forming an aluminum cap film 23 on the surface of the titanium dioxide film 22, and conducting annealing operation of the aluminum cap film 23 in an inert gas ambient, such as a nitrogen gas ambient, at an annealing temperature sufficient to permit formation of active hydrogen atoms through reaction of the aluminum cap film 23 and the hydroxyl groups, thereby enabling hydrogen passivation of oxide traps in the titanium dioxide film 22 through diffusion of the active hydrogen atoms into the titanium dioxide film 22; removing the aluminum cap film 23 from the titanium dioxide film 22; and forming upper and lower electrodes 33, 34 on the titanium dioxide film 22 of the insulator layer 20 and the semiconductor substrate 21, respectively. Note that the insulator layer 20 may further include an oxide film (not shown), such as a silicon dioxide film, based on actual requirements.

In this embodiment, the metal annealing temperature for forming the active hydrogen atoms preferably ranges from 300-500° C., and more preferably from 300-400° C., and the formation of the titanium dioxide film 22 is conducted through metal organic chemical vapor deposition (MOCVD) techniques using tetraisopropoxytitanium (Ti (i-OC$_3$H$_7$)$_4$) and nitrous oxide (N$_2$O) as the reactant. Preferably, the metal organic chemical vapor deposition of the titanium dioxide film 22 is conducted at a temperature ranging from 400-650° C. under a vacuum pressure ranging from 5-20 Torr. Note that the aforesaid hydroxyl groups are formed during metal organic chemical vapor deposition of the titanium dioxide film 22.

Preferably, the titanium dioxide film 22 is subjected to a heat treatment in the presence of oxygen (i.e., oxygen annealing) prior to the formation of the aluminum cap film 23 at a temperature sufficient to permit reduction of oxygen vacancies in the titanium dioxide film 22. Preferably, the oxygen annealing temperature ranges from 700-800° C.

Preferably, the semiconductor substrate 21 is made from silicon, and the upper and lower electrodes 24, 25 are made from aluminum.

In this embodiment, the removal of the aluminum cap film 23 is carried out by wet etching techniques using an aqueous solution that contains H$_3$PO$_4$, HNO$_3$ and CH$_3$COOH.

Figure 3:
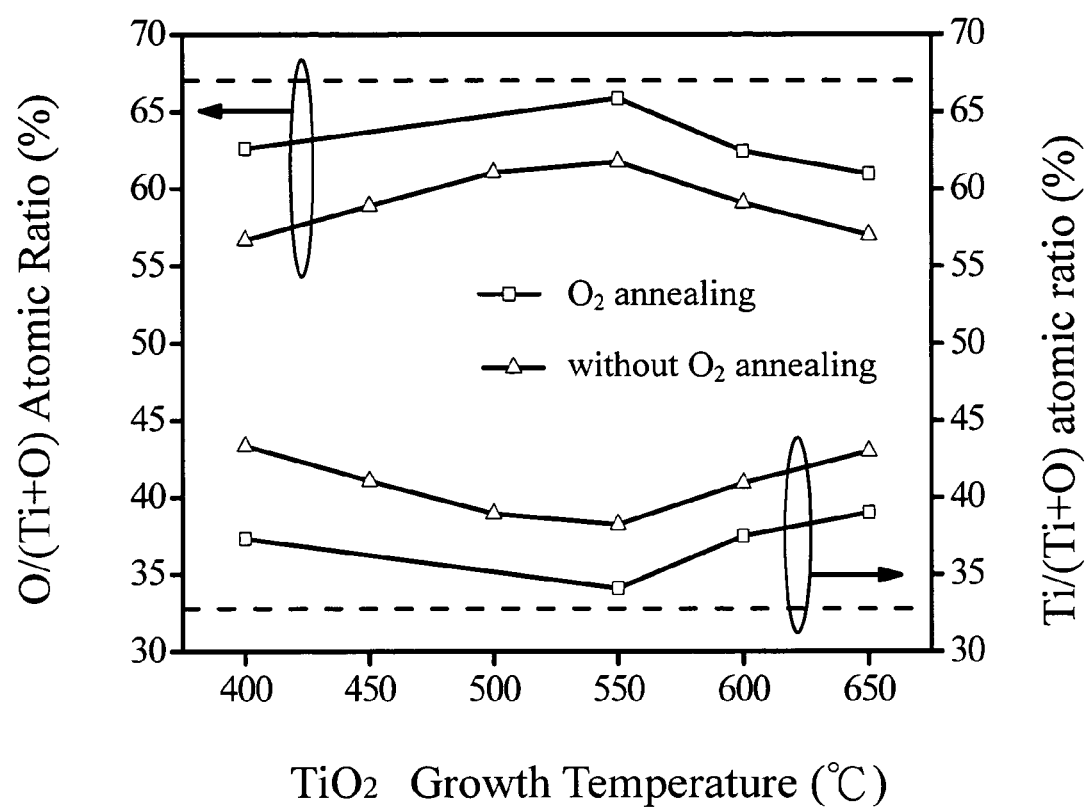
FIG. 3 shows plots of the relation between the atomic ratios of titanium and oxygen and the $TiO_2$ film growth temperature for different $TiO_2$ films with and without oxygen annealing.

FIG. 3 shows plots of the relation between the atomic ratios of titanium and oxygen and the TiO$_2$ film growth temperature for different TiO$_2$ films 22 with and without oxygen annealing. The results show that oxygen content in the titanium dioxide film 22 is increased after oxygen annealing, is increased with the increase in the temperature when the annealing temperature is below 550° C., and is then decreased with the increase in the temperature when the annealing temperature is greater than 550° C. due to incorporation of nitrogen into the titanium dioxide film 22.

Figure 4:
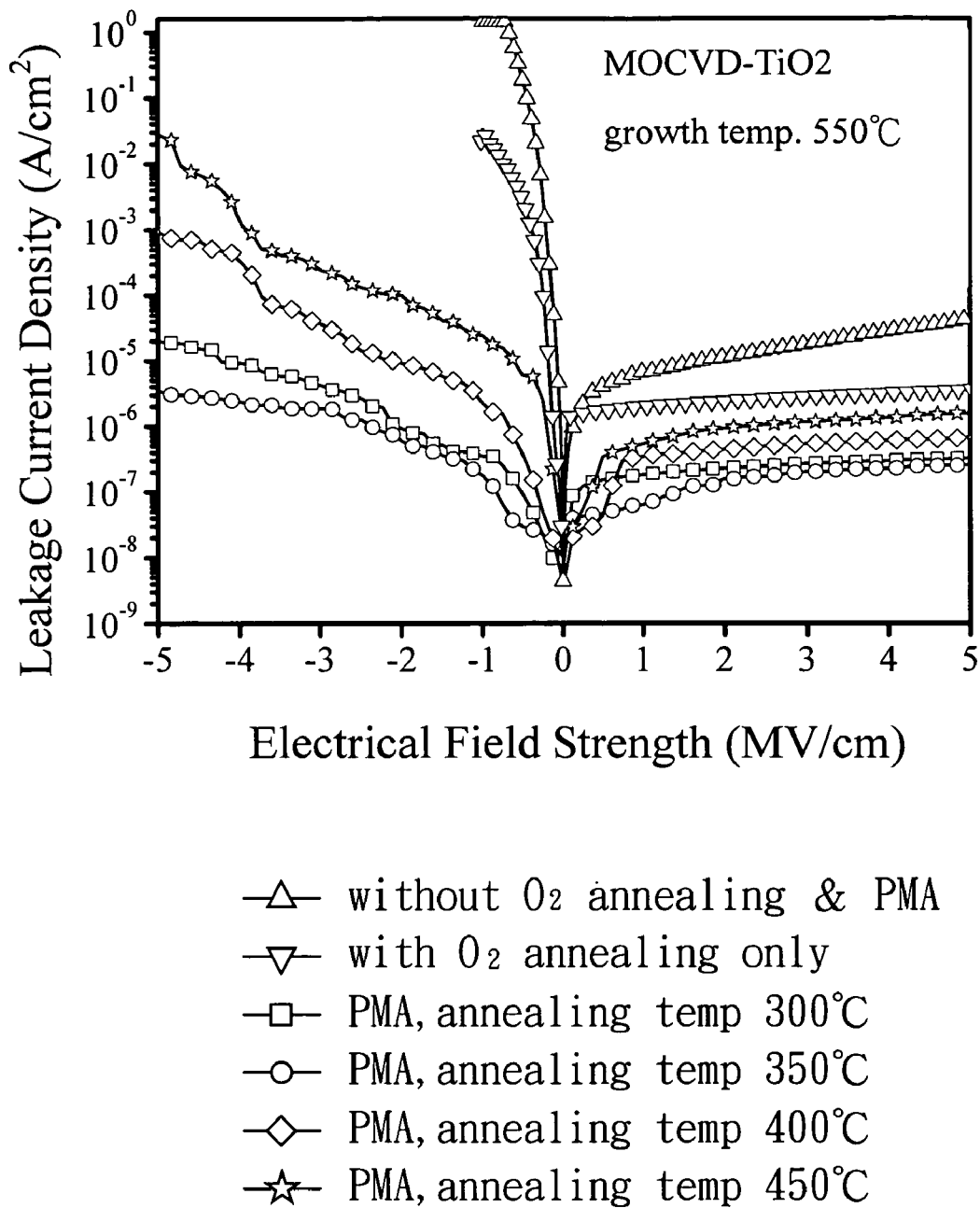
FIG. 4 shows plots of the relation between leakage current density and electric field strength for the MOS devices formed at different PMA temperatures according to the method of the preferred embodiment (i.e., with post-metallization annealing(PMA)) and conventional MOS devices (i.e., without $O_2$ annealing and PMA and with $O_2$ annealing but without PMA)

FIG. 4 shows plots of the relation between leakage current density and electric field strength for the MOS devices formed at different PMA temperatures according to the method of the preferred embodiment (i.e., with post-metallization annealing(PMA)) and conventional MOS devices (i.e., without O$_2$ annealing and PMA and with O$_2$ annealing but without PMA). The results show that the conventional MOS devices have much higher current leakage densities than those of the MOS devices of this invention, which indicates that the leakage current density of MOS devices can be significantly reduced by the hydrogen passivation of the oxide traps in the titanium dioxide film 22. Moreover, the results also show that a minimum current leakage occurs at PMA temperature between 300-400° C.

Figure 5A:
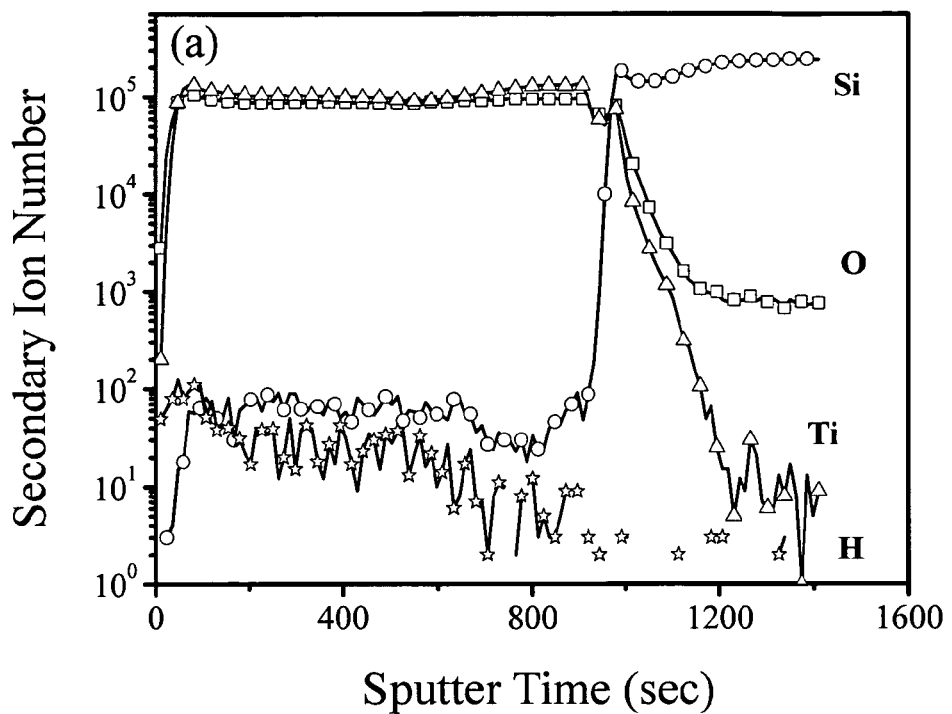
FIG. 5A shows Secondary Ion Mass Spectroscopy (SIMS) graphs for the conventional MOS device, in which a titanium dioxide film is not treated with oxygen annealing and PMA.
Figure 5B:
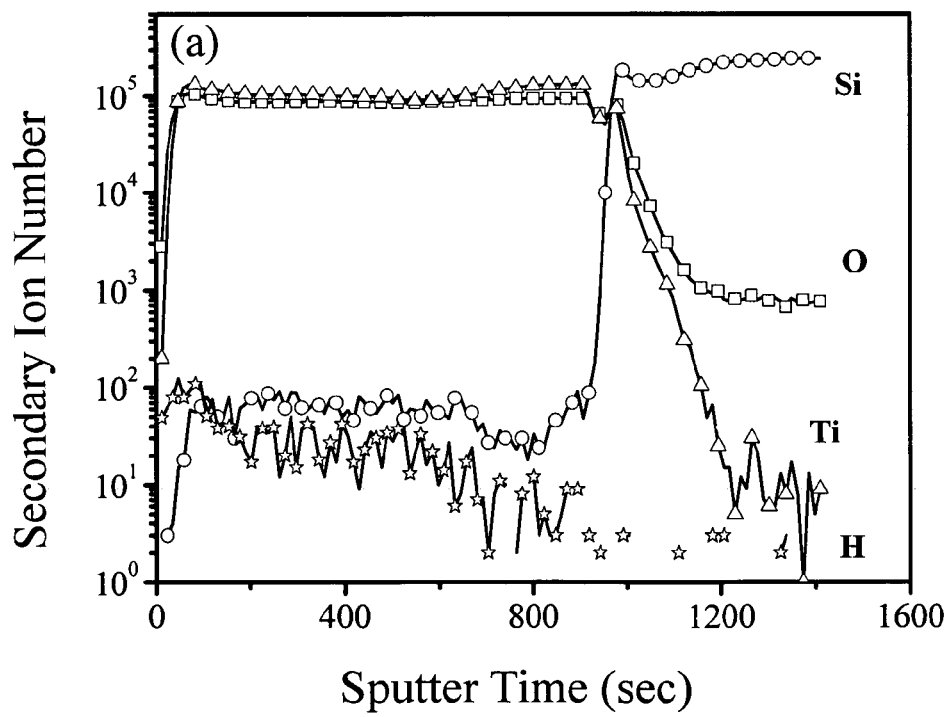
FIG. 5B shows SIMS graphs for the conventional MOS device, in which the titanium dioxide film is treated with oxygen annealing.
Figure 5C:
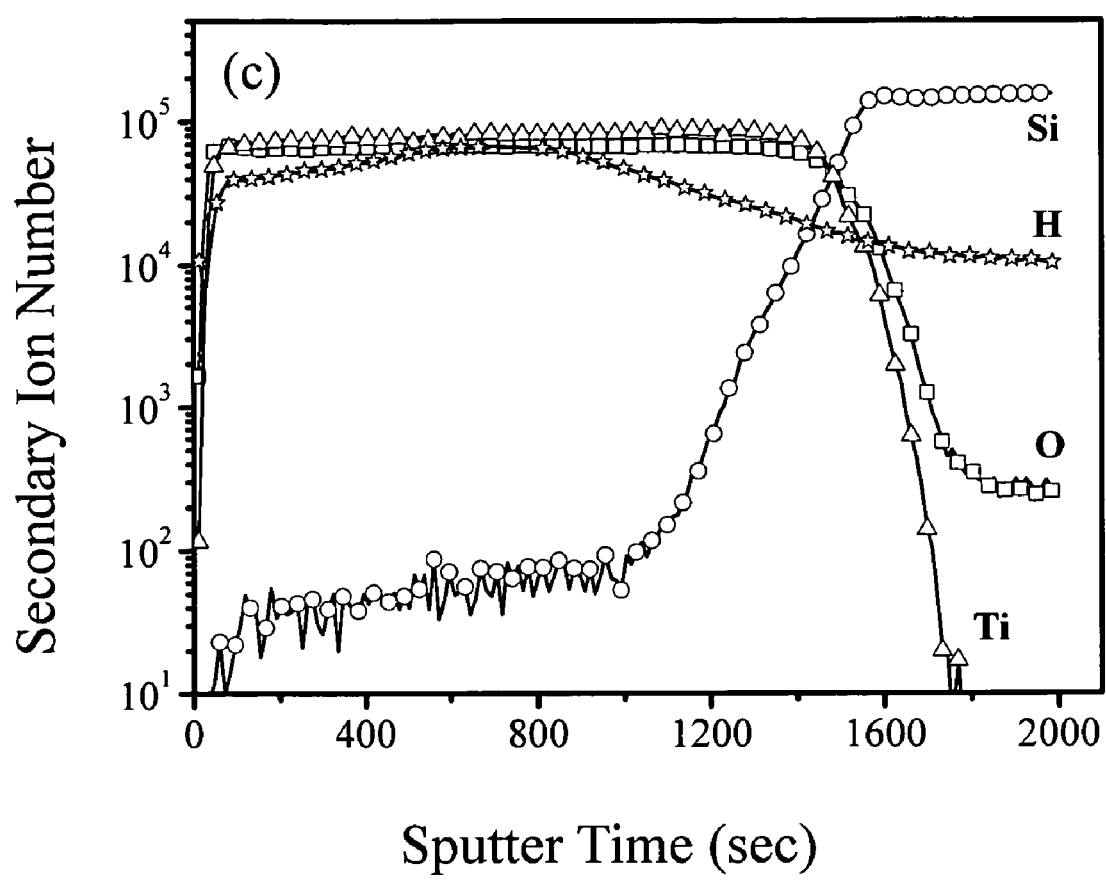
FIG. 5C shows SIMS graphs for the MOS device formed according to the method of the preferred embodiment, in which the titanium dioxide film is treated with oxygen annealing and PMA.

FIGS. 5A-5C respectively show Secondary Ion Mass Spectroscopy (SIMS) graphs for a first conventional MOS device, in which the titanium dioxide film is not treated with oxygen annealing and PMA, a second conventional MOS device, in which the titanium dioxide film is treated with oxygen annealing only, and the MOS device formed according to the method of the preferred embodiment, in which the titanium dioxide film is treated with oxygen annealing and PMA. The results show that the number of detected hydrogen atoms for the preferred embodiment is much greater than those of the conventional MOS devices, which indicates that a significant amount of hydrogen atoms are generated during the PMA process.

Figure 6A:
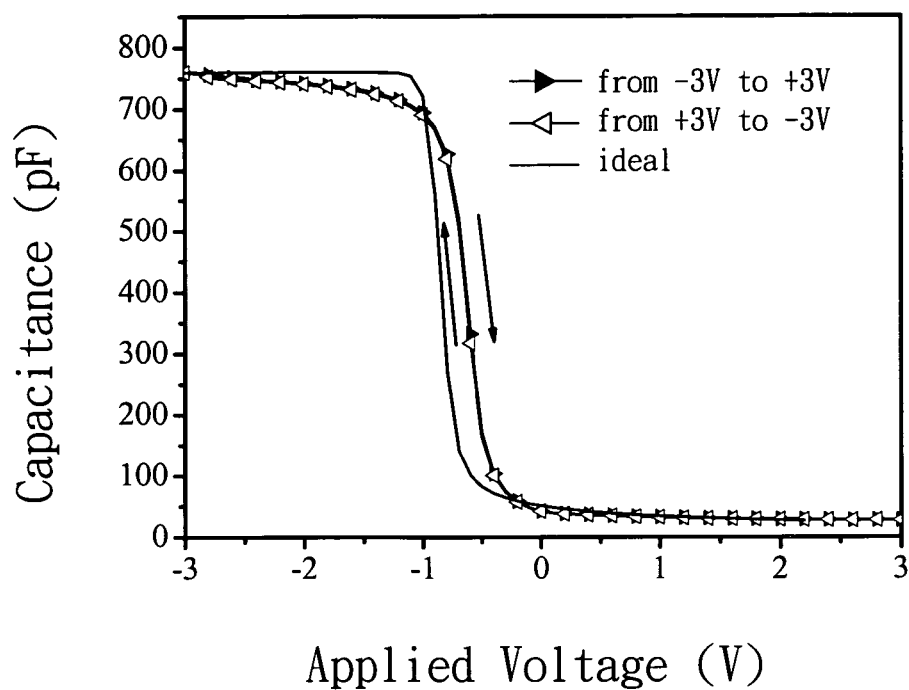
FIG. 6A shows the hysteresis loop of the C-V (capacitance and applied voltage) characteristics of the MOS device formed according to the method of the preferred embodiment, in which the PMA process is conducted at 350° C.

FIG. 6A shows the hysteresis loop of the C-V (capacitance and applied voltage) characteristics of the MOS device formed according to the method of the preferred embodiment, in which the PMA process is conducted at 350° C. The results show that under this PMA temperature, the distortion and voltage shift from the ideal curve is very small, and the hysteresis loop of the C-V characteristics is clockwise, which indicate a very good quality of the titanium dioxide film 22 was achieved.

Figure 6B:
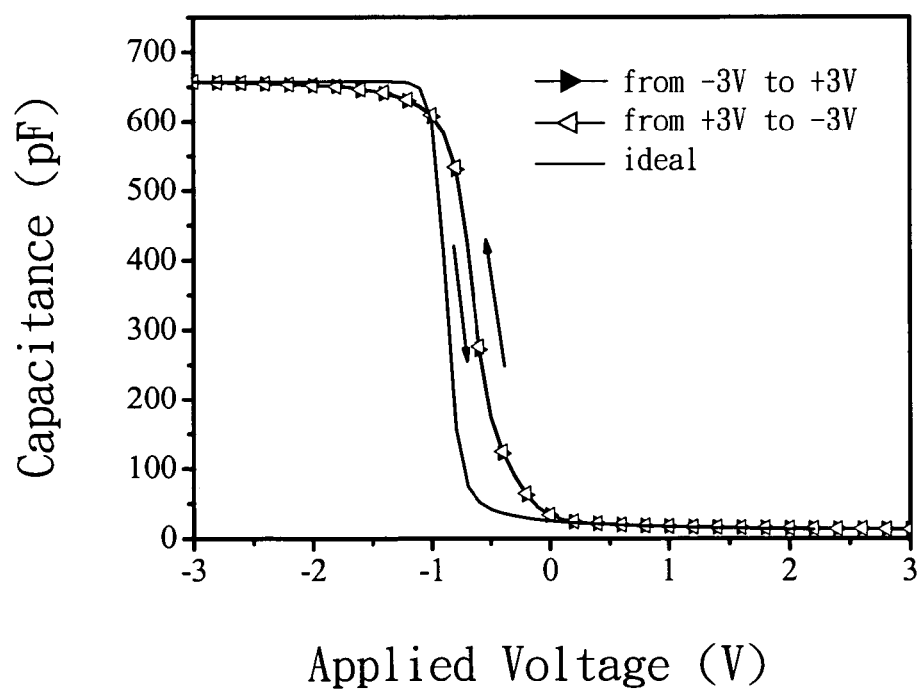
FIG. 6B shows the hysteresis loop of the C-V (capacitance and applied voltage) characteristics of the MOS device formed according to the method of preferred embodiment, in which the PMA process is conducted at 400° C.

FIG. 6B shows the hysteresis loop of the C-V (capacitance and applied voltage) characteristics of the MOS device formed according to the method of the preferred embodiment, in which the PMA process is conducted at 400° C. The results show that under this PMA temperature, the hysteresis loop of the C-V characteristics is counterclockwise, which indicates that when the annealing temperature is higher than 350° C., a portion of hydrogen bonding generated from hydrogen passivation of the oxide traps may be broken. However, the MOS device of FIG. 6B still exhibits a very small distortion and voltage shift from the ideal curve.

The conduction mechanism of the MOS device of FIG. 6A is dominated by mobile ions, while the MOS device of FIG. 6B is dominated by oxide trap charges due to destruction of a portion of hydrogen boding when the PMA temperature is conducted at 400° C., which can result in an increase in current leakage.

Figure 7:
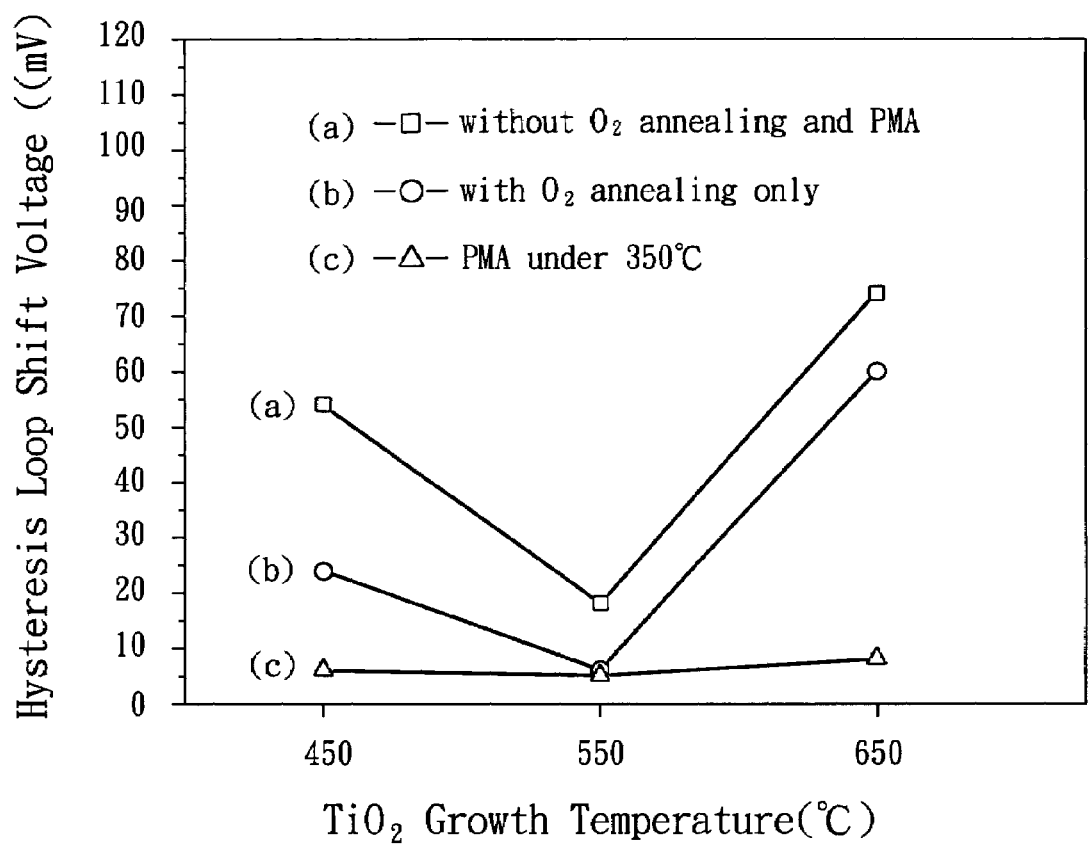
FIG. 7 shows plots of the relation between the hysteresis loop shift voltage and the $TiO_2$ film growth temperature for the MOS device formed according to the method of the preferred embodiment and the conventional MOS devices.

FIG. 7 shows plots of the relation between the hysteresis loop shift voltage and the TiO$_2$ film growth temperature for the MOS device formed according to the method of the preferred embodiment and the conventional MOS devices. The results show that the MOS device of the preferred embodiment has the lowest hysteresis loop shift voltage when compared to those of the conventional MOS devices.

Figure 8:
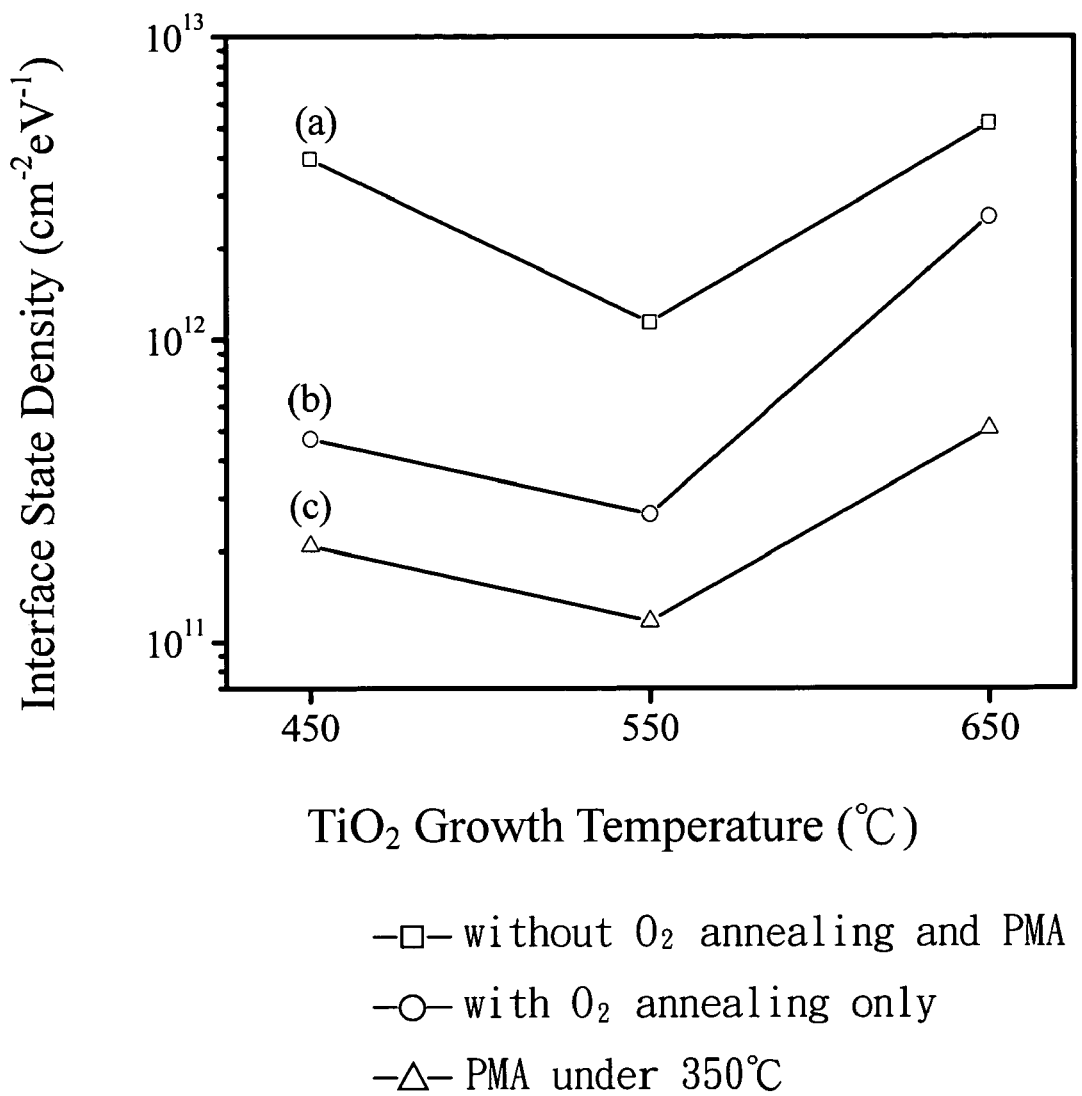
FIG. 8 shows plots of the relation between the interface state density (Dit) and the $TiO_2$ film growth temperature for the MOS device formed according to the method of the preferred embodiment and the conventional MOS devices.

FIG. 8 shows plots of the relation between the interface state density (Dit) and the TiO$_2$ film growth temperature for the MOS device formed according to the method of the preferred embodiment and the conventional MOS devices. The results show that the MOS device of the preferred embodiment has the lowest interface state density when compared to those of the conventional MOS devices, which indicates that the active hydrogen atoms thus formed during the PMA process not only passivate the oxide traps in the titanium dioxide film 22 but also passivate interfacial defects at the interface between the titanium dioxide film 22 and the Si semiconductor substrate 21, as well as grain boundary defects in the titanium dioxide film 22.

EXAMPLE

This invention will now be described in greater detail with reference to the following Example 1.

Example 1

A Si wafer was placed in a quartz reactor tube which was heated to 550° C. and controlled at a vacuum pressure of 5 Torr. Ti (i-OC$_3$H$_7$)$_4$ was vaporized and was carried by nitrogen gas with a flow rate of 10 sccm into the reactor tube. Nitrous oxide (N$_2$O) was also introduced into the reactor tube in a flow rate of 100 sccm so as to react with the vapor to form a TiO$_2$ film on the Si wafer. The thickness of the TiO$_2$ film thus formed was 40 nm. The TiO$_2$ film was then subjected to oxygen annealing at 750° C. for 20 minutes. An aluminum cap film was then formed on the titanium dioxide film, and was subsequently annealed in a nitrogen ambient at a temperature from 300-450° C. for 10 minutes. The aluminum cap film was then removed through wet etching techniques using an aqueous solution containing H$_3$PO$_4$:HNO$_3$:CH$_3$COOH:H$_2$O=73:4:3.5:19.5. Upper and lower electrodes made from aluminum were then deposited on the titanium dioxide film and the Si semiconductor substrate, respectively.

By hydrogen passivation of the oxide traps and the grain boundary defects in the titanium dioxide film 22 formed by MOCVD techniques, and hydrogen passivation of the interfacial defects at the interface between the titanium dioxide film 22 and the semiconductor substrate 21, the MOS device 20 of this invention has a superior capacitor performance than the conventional MOS devices.

With the invention thus explained, it is apparent that various modifications and variations can be made without departing from the spirit of the present invention.

What is claimed is:

1. A method for making a metal-oxide-semiconductor (MOS) device comprising:

forming an insulator layer on a semiconductor substrate, the insulator layer including a titanium dioxide film that has a surface with hydroxyl groups formed thereon; and forming an aluminum cap film on the surface of the titanium dioxide film, and conducting annealing operation of the aluminum cap film at an annealing temperature sufficient to permit formation of active hydrogen atoms through reaction of the aluminum cap film and the hydroxyl groups, thereby enabling hydrogen passivation of oxide traps in the titanium dioxide film through diffusion of the active hydrogen atoms into the titanium dioxide film, wherein formation of the titanium dioxide film of the insulator layer is conducted through metal organic chemical vapor deposition (MOCVD) techniques using tetraisopropoxytitanium (Ti(i-OC$_3$H$_7$)$_4$) and nitrous oxide (N$_2$O) as the reactant.

2. The method of claim 1, wherein the metal organic chemical vapor deposition of the titanium dioxide film of the insulator layer is conducted at a temperature ranging from 400-650° C. under a vacuum pressure ranging from 5-20 Torr.

3. The method of claim 1, wherein the annealing temperature for forming the active hydrogen atoms ranges from 300-400° C.

4. The method of claim 3, wherein the formation of the active hydrogen atoms is conducted in an inert gas ambient.

5. The method of claim 1, further comprising subjecting the titanium dioxide film of the insulator layer to a heat treatment in the presence of oxygen prior to the formation of the aluminum cap film.

6. The method of claim 5, wherein the heat treatment of the titanium dioxide film is conducted at a temperature ranging from 700-800° C.

7. The method of claim 1, wherein the semiconductor substrate is made from silicon.

8. The method of claim 1, further comprising:

removing the aluminum cap film from the titanium dioxide film; and forming upper and lower electrodes on the insulator layer and the semiconductor substrate, respectively.

9. The method of claim 8, wherein the removal of the aluminum cap film is conducted through etching techniques using an aqueous solution that contains H$_3$PO$_4$, HNO$_3$ and CH$_3$COOH.

10. A method for making a metal-oxide-semiconductor (MOS) device comprising:

forming an insulator layer on a semiconductor substrate, the insulator layer including a titanium dioxide film that has a surface with hydroxyl groups formed thereon;

forming an aluminum cap film on the surface of the titanium dioxide film, and conducting annealing operation of the aluminum cap film at an annealing temperature sufficient to permit formation of active hydrogen atoms through reaction of the aluminum cap film and the hydroxyl groups, thereby enabling hydrogen passivation of oxide traps in the titanium dioxide film through diffusion of the active hydrogen atoms into the titanium dioxide film;

removing the aluminum cap film from the titanium dioxide film; and forming upper and lower electrodes on the insulator layer and the semiconductor substrate, respectively.

11. The method of claim 10, wherein the removal of the aluminum cap film is conducted through etching techniques using an aqueous solution that contains H$_3$PO$_4$, HNO$_3$ and CH$_3$COOH.

* * * * *